(12) United States Patent
Pritchard et al.

(10) Patent No.: US 7,331,022 B1
(45) Date of Patent: Feb. 12, 2008

(54) METHOD AND APPARATUS FOR AUTOMATING PIN ASSIGNMENTS

(75) Inventors: Jeffrey Orion Pritchard, Santa Cruz, CA (US); Joel Seely, Fremont, CA (US); Nathan Knight, Santa Cruz, CA (US); Eric Joseph Lechner, Santa Cruz, CA (US)

(73) Assignee: Altera Corporation, San Jose, CA (US)

( * ) Notice: Subject to any disclaimer, the term of this patent is extended or adjusted under 35 U.S.C. 154(b) by 328 days.

(21) Appl. No.: 11/100,686

(22) Filed: Apr. 6, 2005

(51) Int. Cl.
*G06F 17/50* (2006.01)
(52) U.S. Cl. .................. 716/3; 716/5; 716/15
(58) Field of Classification Search .......... 716/1–5, 716/15–18
See application file for complete search history.

(56) References Cited

U.S. PATENT DOCUMENTS

| | | | | |
|---|---|---|---|---|
| 6,581,189 | B1* | 6/2003 | Tain | 716/3 |
| 2002/0108094 | A1* | 8/2002 | Scurry | 716/5 |
| 2003/0208723 | A1* | 11/2003 | Killian et al. | 716/1 |
| 2004/0025126 | A1* | 2/2004 | Culler et al. | 716/5 |
| 2004/0128641 | A1* | 7/2004 | Broberg et al. | 716/18 |
| 2006/0190904 | A1* | 8/2006 | Haji-Aghajani et al. | 716/17 |

* cited by examiner

*Primary Examiner*—Paul Dinh
(74) *Attorney, Agent, or Firm*—Martine Penilla & Gencarella, LLP

(57) ABSTRACT

A method for automating pin assignments through an electronic design automation (EDA) development tool is provided. In the method, components for a chip design are selected and a board in which the chip design is to be implemented is identified. A port of one of the selected components is associated with a pin of the board through a component-based file. Thus, the component-based file maps the port to the pin. By utilizing a component based file, the mapping of the port to the pin is maintained during propagation of the chip design from a component level to a system level, even if the port name should change. A system for generating a chip design is also provided.

19 Claims, 9 Drawing Sheets

| SOPC Name | PCB Component | Component Pin | FPGA Pin |
|---|---|---|---|
| ⊟ sdram_0 | U63 (MT46V16M16TG) | | |
| ⊟ s1 | | | |
| ⊟ zs_addr | | None | ▽ ← 137 |
| zs_addr[0] | | | |
| zs_addr[1] | | | |
| zs_addr[2] | | | |
| zs_addr[3] | | | |
| zs_addr[4] | | | |
| zs_addr[5] | | | |
| zs_addr[6] | | | |
| zs_addr[7] | | | |
| zs_addr[8] | | | |
| zs_addr[9] | | | |
| zs_addr[10] | | | |
| zs_addr[11] | | | |
| ⊞ zs_ba | | | |
| zs_cas_n | | U63.CAS_n | U62.V4 |
| zs_cke | | U63.CKE | U62.R7 |
| zs_cs_n | | U63.CS_n | U62.Y3 |
| ⊞ zs_dq | | | |
| ⊞ zs_dqm | | | |
| zs_ras_n | | | |
| zs_we_n | | | |
| ⊞ seven_seg_pio | | | |
| ⊞ uart12 | | | |
| ⊞ uart0 | | | |

| SOPC Name | PCB Component | Component Pin | FPGA Pin |
|---|---|---|---|
| ⊟ 🗐 sdram_0 | U63 (MT46V16M16TG) | | |
| ⊟ 🗐 s1 | | | |
| ⊟ zs_addr | | | |
| ⤷ zs_addr[0] | | U63.A0 | U62.T6 |
| ⤷ zs_addr[1] | | U63.A1 | U62.V2 |
| ⤷ zs_addr[2] | | U63.A2 | U62.R6 |
| ⤷ zs_addr[3] | | U63.A3 | U62.W2 |
| ⤷ zs_addr[4] | | U63.A4 | U62.R5 |
| ⤷ zs_addr[5] | | U63.A5 | U62.U10 |
| ⤷ zs_addr[6] | | U63.A6 | U62.P4 |
| ⤷ zs_addr[7] | | U63.A7 | U62.V1 |
| ⤷ zs_addr[8] | | U63.A8 | U62.T9 |
| ⤷ zs_addr[9] | | U63.A9 | U62.T8 |
| ⤷ zs_addr[10] | | U63.A10 | U62.AA2 |
| ⤷ zs_addr[11] | | U63.A11 | U62.T10 |
| ⊞ ⤷ zs_ba | | | |
| zs_cas_n | | U63.CAS_n | U62.V4 |
| zs_cke | | U63.CKE | U62.R7 |
| zs_cs_n | | U63.CS_n | U62.Y3 |
| ⊞ ⤷ zs_dq | | | |
| ⊞ ⤷ zs_dqm | | | |
| zs_ras_n | | | |
| zs_we_n | | | |
| ⊞ ⤷ seven_seg_pio | | | |
| ⊞ ⤷ uart12 | | | |
| ⊞ ⤷ uart0 | | | |

METHOD AND APPARATUS FOR AUTOMATING PIN ASSIGNMENTS

BACKGROUND

1. Field of the Invention

This invention relates generally to Electronic Design Automation (EDA) and, in particular, to automating pin assignments through an EDA development tool.

2. Description of the Related Art

In the field of electronics, various electronic design automation tools are useful for automating the process by which integrated circuits, multi-chip modules, boards, etc., are designed and manufactured. In particular, EDA tools are useful in the design of standard integrated circuits, custom integrated circuits (e.g., ASICs), and in the design of custom configurations for programmable integrated circuits. Integrated circuits that may be programmable by a customer to produce a custom design for that customer include programmable logic devices (PLDs). Often, such PLDs are designed and programmed by a design engineer using an electronic design automation tool that takes the form of a software package. These tools commonly offer the designer the option of inputting the design in at least one high-level hardware description language (HDL).

As more and more functionality has been placed onto PLDs, the number of pins provided for communication between the PLD and external devices has drastically increased. The pin assignments for thousands of pins are still handled by a designer manually assigning the pins. That is, the design engineer will specify that the clock is to communicate with pin 1, address 1 is assigned to pin 2, address 2 is assigned to pin 3, and so on. A mistake in manually assigning the pins will cause the system to fail. Additionally, a design engineer may obtain hardware intellectual property (IP) that is placed into a system during design. While the IP provider verifies that the IP block is functional, they do not provide information on how the IP block wires out or any pin assignment information for placing the IP block on a particular printed circuit board. Consequently, the design engineer must manually assign the pins during the design process.

As a result, there is a need to solve the problems of the prior art to automate device pin assignments for the design of an integrated circuit.

SUMMARY

Broadly speaking, the present invention fills these needs by providing a method and apparatus in which pin assignments associated with a particular printed circuit board are captured in component files, which maintain the pin assignments through higher level abstractions of the design process. It should be appreciated that the present invention can be implemented in numerous ways, including as a method, a system, or an apparatus. Several inventive embodiments of the present invention are described below.

In one aspect of the invention, a method for automating pin assignments through an electronic design automation (EDA) development tool is provided. In the method, components for a chip design are selected and a board in which the chip design is to be implemented is identified. A port of one of the selected components is associated with a pin of the board through a component-based file. Thus, the component-based file maps the port to the pin of the identified board. By utilizing a component based file, the mapping of the port to the pin is maintained during propagation of the chip design from a component level to a system level, even if the port name should change. In one embodiment, the method operations are embodied as program instructions on a computer readable medium.

In another aspect of the invention, a system for generating a chip design is provided. The system includes a computing system having a microprocessor, a memory, and a bus providing a communication path between the microprocessor and the memory. The system includes a database accessible by the computing system. The database stores a file associated with a component for the chip design, and a file associated with a development board for which the chip design may be placed onto. The file associated with a component for the chip design maps an output port of the component with a pin of the development board. In one embodiment, the database is incorporated into the computing system. In another embodiment, the component-based file maintains the mapping of the output port to the pin as the design is propagated from a component level to a system level.

Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings, and like reference numerals designate like structural elements.

FIGS. 4B-4D illustrate the automatic assignment of the pins through a graphical user interface in accordance with one embodiment of the invention.

DETAILED DESCRIPTION

An invention is described for an apparatus and method for the automatic assignment of pins for a chip design through a development tool application. It will be obvious, however, to one skilled in the art, that the present invention may be practiced without some or all of these specific details. In other instances, well known process operations have not been described in detail in order not to unnecessarily obscure the present invention.

Electronic design automation (EDA) applications are continually evaluated for techniques to further reduce the design time for developing integrated circuit designs. The embodiments described herein further enhance the functionality provided by these applications by including device pin assignment information into a component file so that the application can automatically perform the pin assignments for a selected board. One skilled in the art will appreciate that many of the components, e.g., various Intellectual Property (IP) blocks, included in the chip design have signals that are routed out to device pins of a printed circuit board to interface with other external devices. Through the embodiments described herein, these pin assignments for various board types are captured in a database file that relieves the need to manually assign ports of the components to corresponding pins. In one embodiment, a wizard may be used to enable a design engineer to select which set of pin assignments to utilize based on the board that the system design incorporates.

Figure 1:
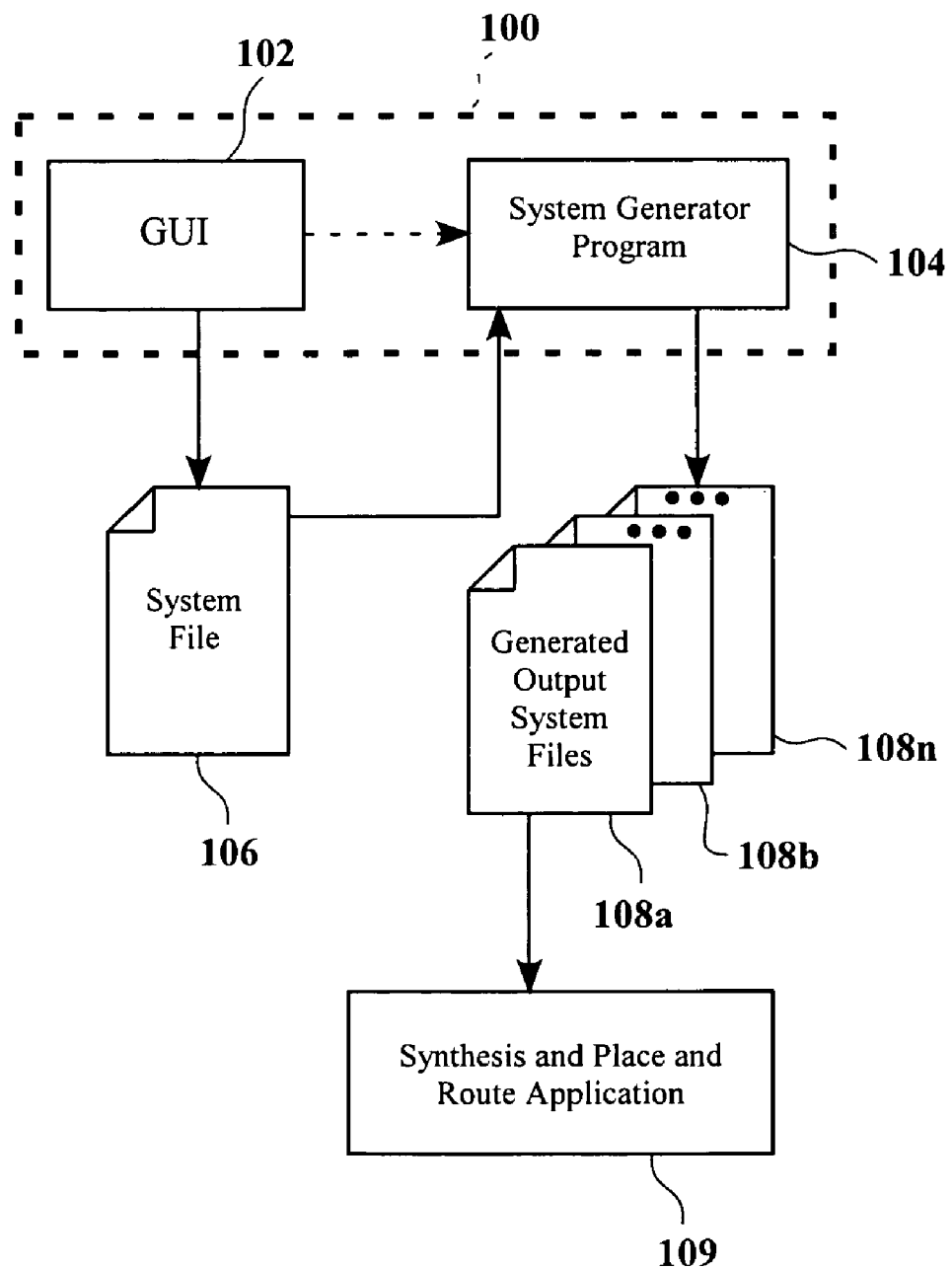
FIG. 1 is a high level simplified schematic diagram of an electronic design automation (EDA) tool for generating a system on a programmable chip (SOPC) design in accordance with one embodiment of the invention.

FIG. 1 is a high level simplified schematic diagram of an electronic design automation (EDA) tool for generating a system on a chip (SOC) design in accordance with one embodiment of the invention. It should be appreciated that the EDA development tool may be used as a platform for composing bus-based systems from common system components placed inside or outside of a programmable logic device (PLD), e.g., a field programmable gate array (FPGA) or other suitable PLD. The tool includes module 100, which incorporates graphical user interface 102 and system generator program 104. Graphical user interface (GUI) 102 provides a set of controls for organizing intellectual property blocks, configuring the system reporting errors, etc. In essence, GUI 102 acts as an editor for system file 106. It should be appreciated that user edits to the system being designed through GUI 102 are recorded in system file 106. Once a user has completed incorporating the components for the SOC, system generator program 104 automatically generates the necessary logic to integrate processors, peripherals, memories, buses, arbitrators, intellectual property functions, and interfaces to logic and memory outside the system across multiple clock domains. In addition, system generator program 104 creates hardware description language (HDL) source code that binds the components together.

Thus, tool 100 of FIG. 1 takes library components as input and emits assembled systems as output. The output is represented as generated output system files 108*a* through 108*n*. System files 108*a* through 108*n* may be used as input for a synthesis and place and route application 109. In one embodiment, tool 100 is incorporated into the synthesis and place and route application 109. For example, tool 100 may be the System on a Programmable Chip (SOPC) builder application of the assignee. In addition, the synthesis and place and route application 109 may be the QUARTUS design software available from the assignee, of which the SOPC builder application may be a component. In this embodiment, the system files are represented as PTF files. It should be appreciated that "PTF" is not an acronym. The backbone of the SOPC Builder Application is the system_name.ptf file, which is generated by the builder program and contains all the needed information about the design. Further information on the SOPC builder application and the QUARTUS design software are available in the SOPC Builder PTF Reference Manual and the QUARTUS II Development Software Handbook available on the assignee's website and both incorporated herein by reference in their entirety for all purposes.

Figure 2:
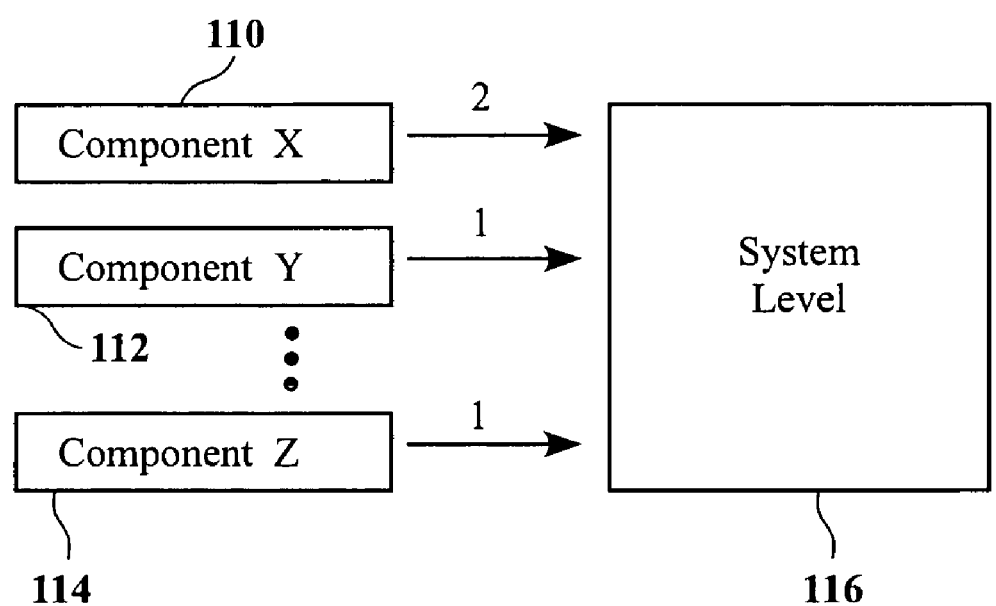
FIG. 2 is a simplified schematic diagram illustrating the incorporation of pin assignments into the component files in order to enable the automatic assignment of pins on a board with corresponding ports of the chip design in accordance with one embodiment of the invention.

FIG. 2 is a simplified schematic diagram illustrating the incorporation of pin assignments into the component files in order to enable the automatic assignment of pins on a board with corresponding ports of the chip design in accordance with one embodiment of the invention. Here, component files 110, 112, and 114 may represent a particular block of logic, e.g., a FIFO, a processor, or some other suitable logic block. In one embodiment, component files 110, 112, and 114 are installed on a system when a library component is installed. One skilled in the art will appreciate that the library components may be embodied as intellectual property components downloaded from a third party vendor or otherwise obtained. Thus, the component files 110, 112, and 114 are not modified by development tool 100. Therefore, the pin assignments incorporated into the component files will not be modifiable by the design engineer when installing components on a system design. System level file 116 incorporates all of the components, selected by a user and contains the saved data for particular user created systems. In one embodiment, system level file 116 contains a module section for each instance of a library component in the system. Each time a new component is added to the system, the development tool of FIG. 1 may add a corresponding module section to the system file 116 of FIG. 2. For example, system file 116 includes two instantiations of component X of component file 110.

With reference to the SOPC Builder Tool of the assignee, component files 110, 112, and 114 correspond to the class.ptf files while system level file 116 corresponds to the system.ptf file. The class.ptf file contains the information about the component and how the SOPC Builder Tool should integrate the component into a larger system. The process of converting a user defined block of logic into an SOPC Builder component is to crate a class.ptf file and then populating the file with the appropriate information, e.g., pin assignments for the corresponding board and the output ports of the user defined block of logic. The system.ptf files contain design information for systems being edited and generated. A unique system.ptf file is created for each new system design. Thus, class.ptf files declare SOPC Builder library components, while the system.ptf files contain saved design data for particular user-created systems. In one embodiment, where multiple top-level I/O ports are instantiated for the same component type, the ports are renamed to avoid name space conflicts. For example, where a system contains two Universal asynchronous receiver-transmitters (UART), each UART is instantiated within the system module and each has a txd pin and a rxd pin. As it is not meant for each UART to drive the same txd pin or receive data from the same rxd pin, the system generator program referenced in FIG. 1, will instantiate each of the UARTs with different names for each UART txd pin and rxd pin. It should be appreciated that while specific mention is made to the SOPC Builder Application Tool, the invention is not limited to this tool and may be applied to any suitable EDA development tool where the automation of pin assignments is beneficial.

Figure 3:
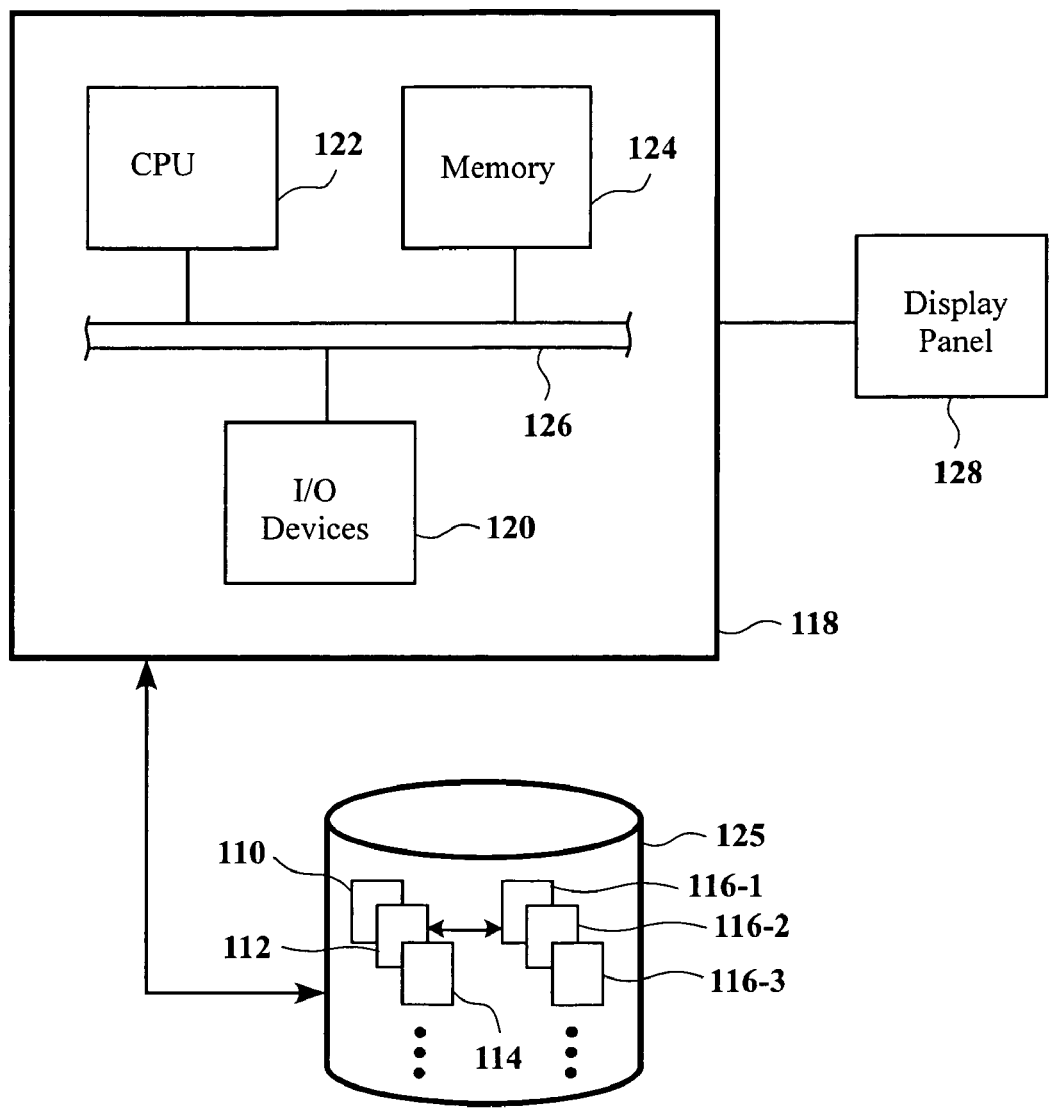
FIG. 3 is a simplified schematic diagram of a system for generating a chip design in which the pin assignments are automated in accordance with one embodiment of the invention.

FIG. 3 is a simplified schematic diagram of a system for generating a chip design in which the pin assignments are automated in accordance with one embodiment of the invention. Computing system 118 includes memory 124, central processing unit 122, input/output (IO) devices 120 all in communication with each other over bus 126. It should be appreciated that computing device 118 may be a general-purpose computer or a dumb terminal connected to a network. Display panel 128 provides for the presentation of data being processed by computing device 118. Database 125 includes component files 110, 112, and 114 and corresponding system files 116-1, 116-2, and 116-3 developed by a user through the development tool with reference to FIG. 2. As mentioned above, component files 110, 112, and 114 contain the pin assignment information for the particular board.

Figure 4A:
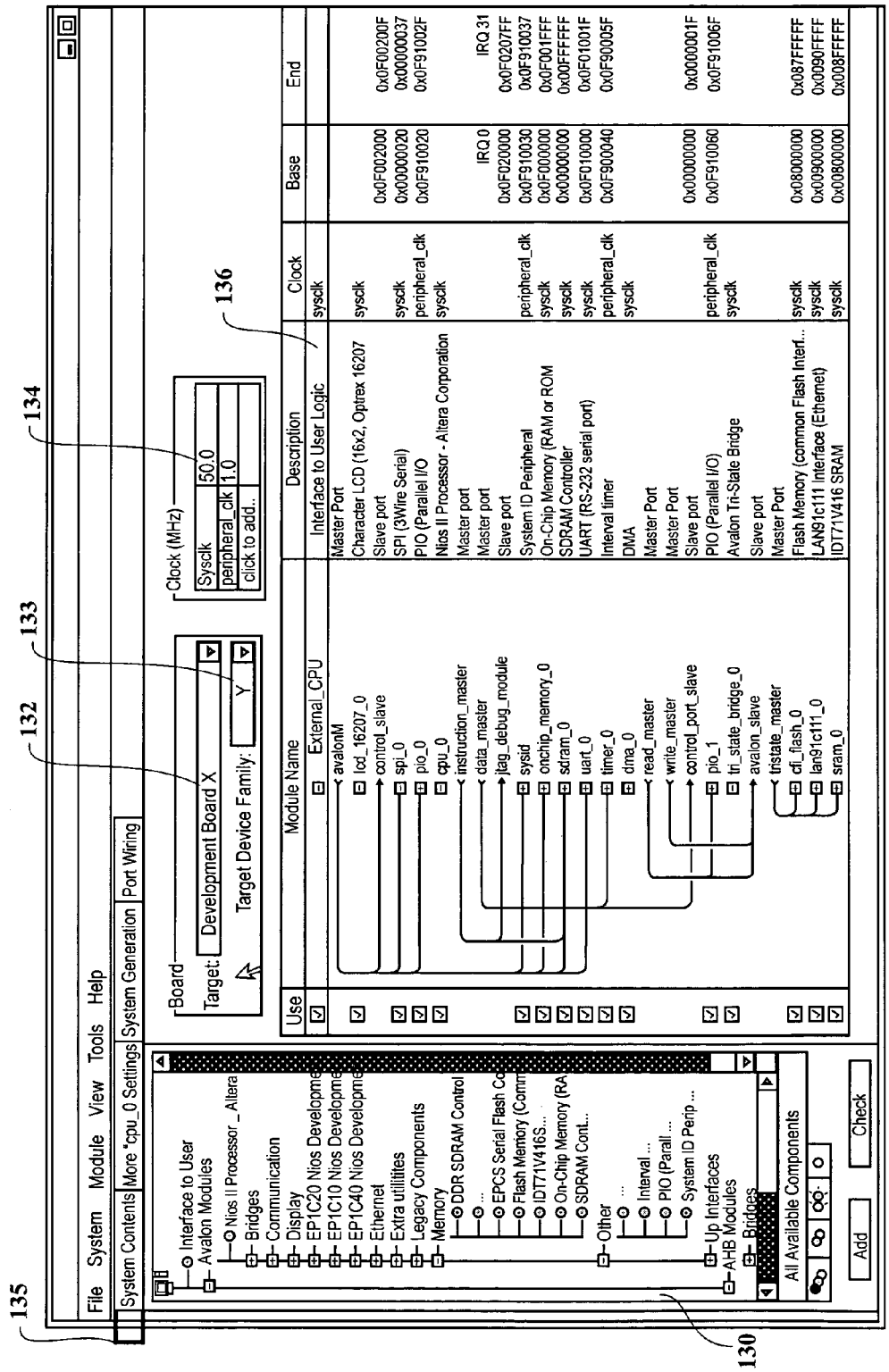
FIG. 4A is an exemplary diagram of a graphical user interface that may be presented on the display screen of FIG. 3 in accordance with one embodiment of the invention.

FIG. 4A is an exemplary diagram of a graphical user interface that may be presented on the display screen of FIG. 3 in accordance with one embodiment of the invention. It should be appreciated that graphical user interface of FIG. 4A is used to define the system being generated through the development tool. Module pool region 130 includes a list of available library components and displays all of the components that have been selected for the system in module table region 136. In one embodiment, module pool region 130 organizes the components according to a bus type and a category. Module table region 136 enables adding components to the system, including bridges, bus interfaces, CPUs, memory interfaces, peripherals, etc. Drop down menu 132 of the graphical user interface enables a user to select a development board in which the system design being generated may be incorporated onto. Drop down window 133 allows a user to define a target device family, e.g., any of the device families commercially available from the assignee. Window 134 of the graphical user interface enables a user to enter clock frequencies for the system and peripherals. It should be appreciated that through the selection of the board, the device family and the components being defined within the system, the pin assignments will be triggered. In one embodiment, the user may select among alternative pin assignments.

Figure 4C:
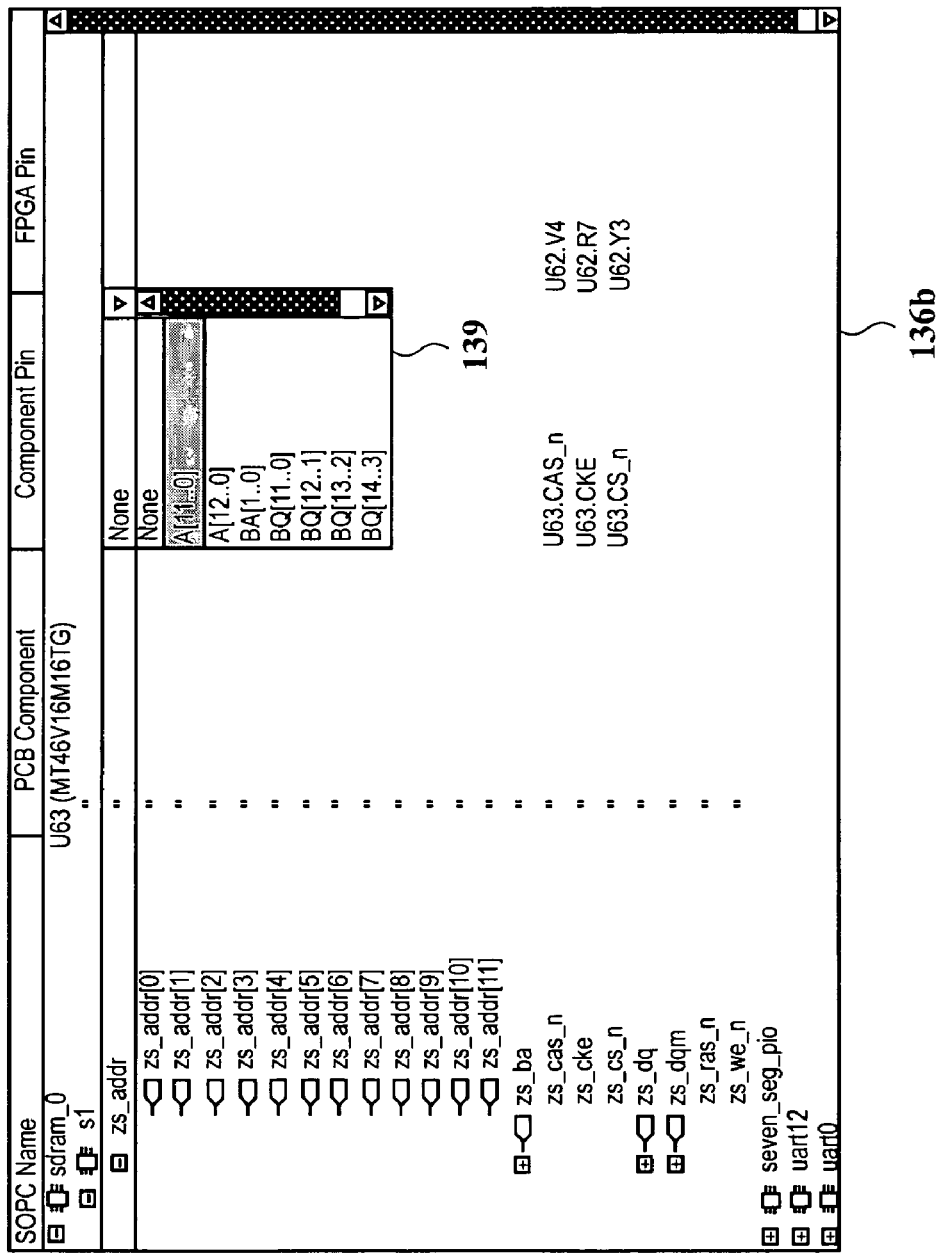

In another embodiment, clicking on the port region tab of tab line 135 will result in window 136b of FIG. 4B appearing in place of module table region 136. Clicking on region 137 within window 136b causes drop down menu 139 of FIG. 4C to appear. Within drop down menu 139, a user may select an address range to make the pin assignments when there is not a one-one correspondence between the ports and the pins. Selection of a range then results in the automatic assignment of the pins and the ports as illustrated in FIG. 4D. As can be seen in region 141 the component pin and corresponding FPGA pin are assigned to each other according to a mapping table that results in the component pin and FPGA pin pairings of FIG. 4D in region 141. It should be appreciated that this mapping table allows the user to map SOPC instances to components on the board, to map busses of SOPC instances to busses on any component on the board, or to map pins of the SOPC instance to pins on any component on the board. To map directly to components requires that the components specify the particular types of busses/pins on the board. SOPC Builder can then map the types directly to types on the instance within SOPC Builder.

Figure 5:
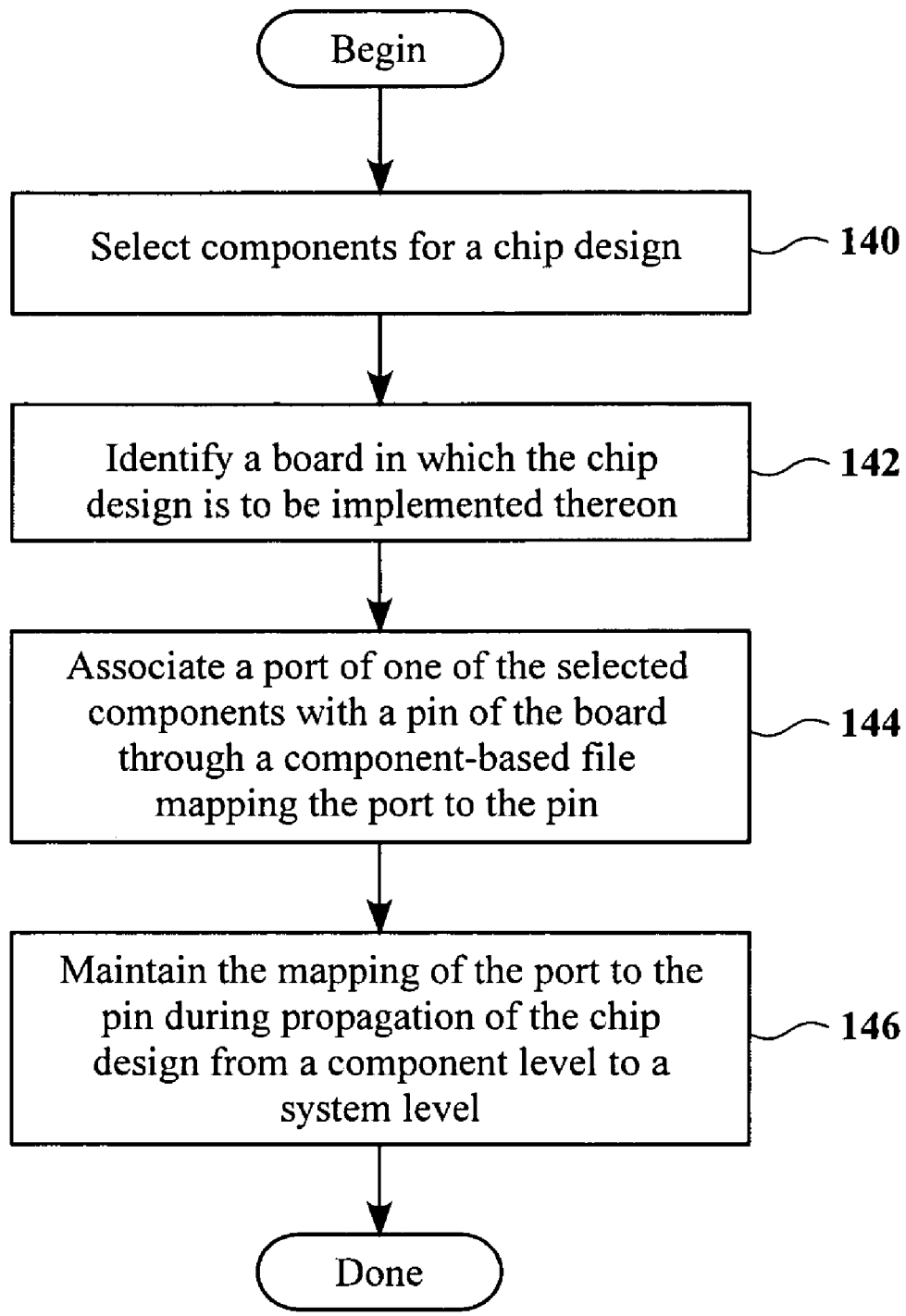
FIG. 5 is a flow chart diagram illustrating the method operations for automating pin assignments through an electronic design automation development tool in accordance with one embodiment of the invention.

FIG. 5 is a flow chart diagram illustrating the method operations for automating pin assignments through an electronic design automation development tool in accordance with one embodiment of the invention. The method initiates with operation 140 where components for a chip design are selected. For example, the components may be selected from a library of components associated with the design tool. These components may include IP blocks, and any other suitable logic blocks for the SOC or SOPC. The method then advances to operation 142 where a board in which the chip design is to be implemented thereon is identified. It should be appreciated that numerous development boards are available and the pins, e.g., routing of wires in the printed circuit board, may differ among the development boards. The method then proceeds to operation 144 where a port of one of the selected components is associated with a pin of the board through a component-based file that maps the port to the pin. With reference to FIG. 2, the component files incorporate pin assignments according to the board selected. The method then moves to operation 146 where the mapping of the port to the pin is maintained during propagation of the chip design from a component level to a system level. One skilled in the art will appreciate that when propagating the chip design to the system level, system and board-level nodes may be renamed in order to avoid conflicts. Additionally, it is possible that nodes on the PCB may traverse through so-called pass-through components, e.g. termination resistors. However, the embodiments described herein maintain the original mapping of the port to the associated pin-name on the board component regardless of the number of renaming levels that occur.

Figure 6:
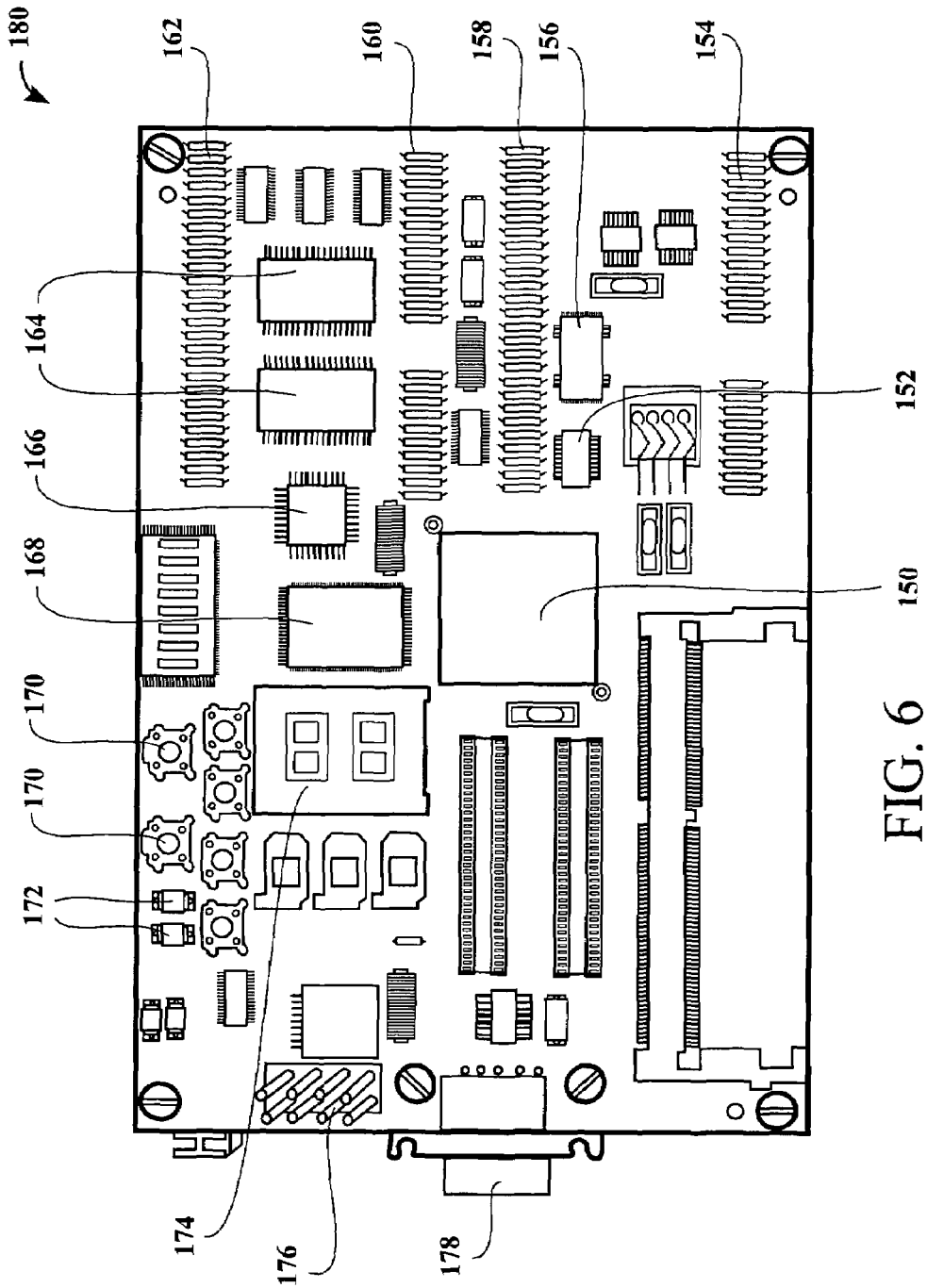
FIG. 6 is an exemplary printed circuit board (PCB) in which a SOPC chip design may be incorporated onto in accordance with one embodiment of the invention.

FIG. 6 is an exemplary printed circuit board (PCB) in which a SOPC chip design may be incorporated onto in accordance with one embodiment of the invention. Development board 180 includes PLD 150, flash memory 168, and configuration controller 166. In one embodiment, PCB 180 is the NIOS™ development board having a hardware platform enabling development of devices based on the APEX™ family of available form the assignee. Oscillator 156 and clock control chip 152 supply the timing signals. Blocks 154, 158, 160, and 162 represent pins enabling access to user I/O's. Also included on PCB 180 are static random access memory (SRAM) 164, push button switches 170 and light emitting diodes (LED) 172. Display 174, Joint Test Action Group (JTAG) port 176, and serial port 178 are also included. It should be appreciated on such a board that the automatic pin assignments provided by the embodiments described herein, as opposed to manual pin assignments, enable a design engineer to more efficiently generate a system design. It should further be appreciated that PCB 180 of FIG. 6 is shown for exemplary purposes only and that the generation of automatic pin assignments discussed above may be applied to any suitable printed circuit board.

In summary, the above-described invention provides a method and apparatus for enhancing the functionality of an EDA tool by automatically generating pin assignments that are captured in a component level file according to a printed circuit board that the chip design will be incorporated onto. Component files associated with a development tool application capture the pin assignments for a particular board. These assignments are maintained as the component files are manipulated to develop a system file, even in instances where the ports of a particular component are renamed, e.g., where multiple instantiations of the same component are defined on a system.

In one implementation, the automatic assignment is triggered through a script created when the EDA development tool application is run. The script may look at the top level design file to determine the names of the corresponding top level pins connected to the system's exported signals. In one embodiment, the script is prevented from being run before the EDA development tool generated system is instantiated in a top-level design file. Thus, once the system block has been instantiated in a top-level design file, the script will run. Where the EDA development tool is incorporated into a synthesis and place and route application as described above, the analysis step of the analysis step of the synthesis tool may automatically check for the existence of the pin assignment script, and run the script if necessary. If any exported signals from the EDA development tool generated system are not connected to device pins at the top-level, a warning message is issued and displayed and a pin assignment is not made for that signal.

It should be appreciated that the system design being optimized through the above-described embodiments may be incorporated into a programmable logic device. The programmable logic device may be part of a data processing system that includes one or more of the following components; a processor; memory; I/O circuitry; and peripheral devices. The data processing system can be used in a wide variety of applications, such as computer networking, data networking, instrumentation, video processing, digital signal processing, or any suitable other application where the advantage of using programmable or re-programmable logic is desirable. The programmable logic device can be used to perform a variety of different logic functions. For example, the programmable logic device can be configured as a processor or controller that works in cooperation with a system processor. The programmable logic device may also be used as an arbiter for arbitrating access to a shared resource in the data processing system. In yet another example, the programmable logic device can be configured as an interface between a processor and one of the other components in the system.

With the above embodiments in mind, it should be understood that the invention may employ various computer-implemented operations involving data stored in computer systems. These operations are those requiring physical manipulation of physical quantities. Usually, though not necessarily, these quantities take the form of electrical or magnetic signals capable of being stored, transferred, combined, compared, and otherwise manipulated. Further, the manipulations performed are often referred to in terms, such as producing, identifying, determining, or comparing.

Any of the operations described herein that form part of the invention are useful machine operations. The invention also relates to a device or an apparatus for performing these operations. The apparatus may be specially constructed for the required purposes, or it may be a general-purpose computer selectively activated or configured by a computer program stored in the computer. In particular, various general-purpose machines may be used with computer programs written in accordance with the teachings herein, or it may be more convenient to construct a more specialized apparatus to perform the required operations.

The invention can also be embodied as computer readable code on a computer readable medium. The computer readable medium is any data storage device that can store data, which can be thereafter read by a computer system. The computer readable medium also includes an electromagnetic carrier wave in which the computer code is embodied. Examples of the computer readable medium include hard drives, network attached storage (NAS), read-only memory, random-access memory, CD-ROMs, CD-Rs, CD-RWs, magnetic tapes, and other optical and non-optical data storage devices. The computer readable medium can also be distributed over a network coupled computer system so that the computer readable code is stored and executed in a distributed fashion.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims. In the claims, elements and/or steps do not imply any particular order of operation, unless explicitly stated in the claims.

What is claimed is:

1. A method for automating pin assignments through an electronic design automation (EDA) development tool, comprising the operations of:
    selecting components for a chip design;
    identifying a board in which the chip design is to be implemented thereon;
    associating a port of one of the selected components with a pin of the board through a component-based file mapping the port to the pin;
    maintaining the mapping of the port to the pin during propagation of the chip design from a component level to a system level; and
    propagating the mapping of the port to the pin for multiple instantiations of one of the selected components through hierarchical levels associated with the propagation of the chip design.

2. The method of claim 1, further comprising:
    establishing a file mapping a port of one of the components to a pin of the board; and
    storing the file in a component database of the EDA development tool.

3. The method of claim 1, wherein the method operation of maintaining the mapping of the port to the pin during propagation of the chip design from a component level to a system level includes,
    instantiating one of the selected components multiple times;
    renaming an identifier of all except one of the multiple instantiations.

4. The method of claim 1, wherein the method operation of associating a port of one of the selected components with a pin of the board through a component-based file mapping the port to the pin includes,
    querying for a number of instantiations of the one of the selected components.

5. The method of claim 1, further comprising:
    generating a log file of the system level chip design.

6. The method of claim 5, further comprising:
    delivering the log file to a synthesis tool capable of applying place and route functionality.

7. The method of claim 6, further comprising:
    executing a script that determines the port and corresponding assigned pin from the system level chip design prior to the method operation of delivering the log file to a synthesis tool capable of applying place and route functionality.

8. The method of claim 1, further comprising:
    associating a bus of one of the selected components with a bus on the board; and
    associating one of the selected components with a component on the board.

9. A computer readable medium having program instructions for automating pin assignments through an electronic design automation (EDA) development tool, comprising the operations of:
    program instructions for selecting components for a chip design;
    program instructions for identifying a board in which the chip design is to be implemented on;
    program instructions for associating a port of one of the selected components with a pin of the board through a component-based file mapping the port to the pin;

program instructions for maintaining the mapping of the port to the pin during propagation of the chip design from a component level to a system level; and program instructions for propagating the mapping of the port to the pin for multiple instantiations of one of the selected components through hierarchical levels associated with the propagation of the chip design.

10. The computer readable medium of claim 9, further comprising:

program instructions for establishing a file mapping a port of one of the components to a pin of the board; and program instructions for storing the file in a component database of the EDA development tool.

11. The computer readable medium of claim 9, wherein the program instructions for maintaining the mapping of the port to the pin during propagation of the chip design from a component level to a system level includes, program instructions for instantiating the one of the selected component multiple times;

program instructions for renaming an identifier of all except one of the multiple instantiations.

12. The computer readable medium of claim 9, wherein the program instructions for associating a port of one of the selected components with a pin of the board through a component-based file mapping the port to the pin includes, program instructions for querying for a number of instantiations of the one of the selected components.

13. The computer readable medium of claim 9, further comprising:

program instructions for generating a log file of the system level chip design; and program instructions for delivering the log file to a synthesis tool capable of applying place and route functionality.

14. The computer readable medium of claim 13, further comprising:

program instructions for executing a script that determines the port and corresponding assigned pin from the system level chip design prior to delivering the log file to a synthesis tool capable of applying place and route functionality.

15. A system for generating a chip design, comprising:

a computing system, the computing system including,
  a microprocessor;
  a memory; and
  a bus providing a communication path between the microprocessor and the memory;

a database accessible by the computing system, the database storing a file associated with a component for the chip design, and a file associated with a development board for which the chip design is to be placed thereon, the file associated with a component for the chip design mapping an output port of the component with a pin of the development board, wherein the mapping of the output port to the pin for multiple instantiations of the component as the component is renamed, is maintained through hierarchical levels associated with the propagation of the chip design.

16. The system of claim 15, wherein the mapping of the output port with the pin is preserved as the chip design propagates from a component level to a system level.

17. The system of claim 15, wherein the database is integrated into the computing system.

18. The system of claim 15, further comprising:

a display panel enabled to display a user interface illustrating the output port being associated with the pin.

19. The system of claim 15, wherein the database is an element of an electronic design automation tool.

* * * * *